United States Patent [19]

Rafter et al.

[11] Patent Number: 4,774,495

[45] Date of Patent: Sep. 27, 1988

[54] VIDEO MONITOR INTERFACE CIRCUIT FOR DIGITAL COLOR SIGNALS

[75] Inventors: Patrick M. Rafter, Knoxville; Donald B. Wolter, Pigeon Forge, both of Tenn.

[73] Assignee: North American Philips Consumer Electronics Corp., New York, N.Y.

[21] Appl. No.: 903,006

[22] Filed: Sep. 2, 1986

[51] Int. Cl.$^4$ .............................................. H03M 1/66

[52] U.S. Cl. ....................................... 341/144; 358/28

[58] Field of Search .................. 340/347 DA; 358/28, 358/44, 160

[56] References Cited

U.S. PATENT DOCUMENTS 3,744,050 7/1973 Hedrick ........................ 340/347 DA 4,216,460 8/1980 Baldwin et al. ......... 340/347 DD X 4,547,797 10/1985 Mick .................................... 358/28

*Primary Examiner*—William M. Shoop, Jr.

*Assistant Examiner*—Richard K. Blum

*Attorney, Agent, or Firm*—Thomas A. Briody; Jack E. Haken; Leroy Eason

[57] ABSTRACT

An interface circuit for translating digital signals signifying colors in any of various color formats into analog signals for controlling respective primary colors of a display monitor operating in a standard R, G, B primary color format. The circuit adds a control bit to each digital signal identifying the color format of the signal, and each of the colors signified by respective digital signals are identified by digital words corresponding thereto stored in a digital memory. The bits of each stored word control respective levels of analog signal attenuation in analog summing networks for converting each of such words into respective R, G, B analog signals for the video monitor. Changing the value of the control bit changes the word read-out from the memory in accordance with the particular color format of the received digital signals.

5 Claims, 6 Drawing Sheets

COLOR FORMAT F1

| COLOR | PROCESSOR DIGITAL COLOR SIGNALS I (8) | B (4) | G (2) | R (1) | ANALOG COLOR SIGNAL WEIGHTINGS (IN PERCENT) FOR STANDARD COLOR FORMAT B | G | R |
|---|---|---|---|---|---|---|---|
| BLACK | 0 | 0 | 0 | 0 | 0 | 0 | 0 |
| RED | 0 | 0 | 0 | 1 | 0 | 0 | 66 |
| GREEN | 0 | 0 | 1 | 0 | 0 | 66 | 0 |
| BROWN | 0 | 0 | 1 | 1 | 0 | 46 | 66 |
| BLUE | 0 | 1 | 0 | 0 | 66 | 0 | 0 |
| MAGENTA | 0 | 1 | 0 | 1 | 66 | 0 | 66 |
| CYAN | 0 | 1 | 1 | 0 | 66 | 66 | 0 |
| WHITE | 0 | 1 | 1 | 1 | 66 | 66 | 66 |
| GREY | 1 | 0 | 0 | 0 | 33 | 33 | 33 |
| LT. RED | 1 | 0 | 0 | 1 | 33 | 33 | 100 |
| LT. GREEN | 1 | 0 | 1 | 0 | 33 | 100 | 33 |
| LT. YELLOW | 1 | 0 | 1 | 1 | 33 | 100 | 100 |
| LT. BLUE | 1 | 1 | 0 | 0 | 100 | 33 | 33 |
| LT. MAGENTA | 1 | 1 | 0 | 1 | 100 | 33 | 100 |
| LT. CYAN | 1 | 1 | 1 | 0 | 100 | 100 | 33 |
| WHITE (INTENSIFIED) | 1 | 1 | 1 | 1 | 100 | 100 | 100 |

COLOR FORMAT F1

| COLOR | PROCESSOR DIGITAL COLOR SIGNALS I (8) | B (4) | G (2) | R (1) | ANALOG COLOR SIGNAL WEIGHTINGS (IN PERCENT) FOR STANDARD COLOR FORMAT B | G | R |
|---|---|---|---|---|---|---|---|
| BLACK | 0 | 0 | 0 | 0 | 0 | 0 | 0 |
| RED | 0 | 0 | 0 | 1 | 0 | 0 | 66 |
| GREEN | 0 | 0 | 1 | 0 | 0 | 66 | 0 |
| BROWN | 0 | 0 | 1 | 1 | 0 | 46 | 66 |
| BLUE | 0 | 1 | 0 | 0 | 66 | 0 | 0 |
| MAGENTA | 0 | 1 | 0 | 1 | 66 | 0 | 66 |
| CYAN | 0 | 1 | 1 | 0 | 66 | 66 | 0 |
| WHITE | 0 | 1 | 1 | 1 | 66 | 66 | 66 |
| GREY | 1 | 0 | 0 | 0 | 33 | 33 | 33 |
| LT. RED | 1 | 0 | 0 | 1 | 33 | 33 | 100 |
| LT. GREEN | 1 | 0 | 1 | 0 | 33 | 100 | 33 |
| LT. YELLOW | 1 | 0 | 1 | 1 | 33 | 100 | 100 |
| LT. BLUE | 1 | 1 | 0 | 0 | 100 | 33 | 33 |
| LT. MAGENTA | 1 | 1 | 0 | 1 | 100 | 33 | 100 |
| LT. CYAN | 1 | 1 | 1 | 0 | 100 | 100 | 33 |
| WHITE (INTENSIFIED) | 1 | 1 | 1 | 1 | 100 | 100 | 100 |

FIG. 1B

COLOR FORMAT F2

| COLOR | PROCESSOR DIGITAL COLOR SIGNALS (8) I | (4) B | (2) G | (1) R | ANALOG COLOR SIGNAL WEIGHTINGS (IN PERCENT) FOR STANDARD COLOR FORMAT B | G | R |
|---|---|---|---|---|---|---|---|
| BLACK | 0 | 0 | 0 | 0 | 0 | 0 | 0 |
| MAGENTA | 0 | 0 | 0 | 1 | 25 | 17 | 42 |
| DK. BLUE | 0 | 0 | 1 | 0 | 50 | 26 | 13.5 |
| PURPLE | 0 | 1 | 1 | 1 | 75 | 46 | 58 |
| DK. GREEN | 0 | 1 | 0 | 0 | 25 | 26 | 0 |
| DK. GREY | 0 | 1 | 0 | 1 | 50 | 46 | 42 |
| MED. BLUE | 0 | 1 | 1 | 0 | 75 | 54 | 13.5 |
| LT. BLUE | 0 | 1 | 1 | 1 | 100 | 72 | 58 |
| BROWN | 1 | 0 | 0 | 0 | 0 | 26 | 42 |
| ORGANGE | 1 | 0 | 0 | 1 | 25 | 46 | 85 |
| LT. GREY | 1 | 0 | 1 | 0 | 50 | 54 | 58 |
| PINK | 1 | 0 | 1 | 1 | 75 | 72 | 100 |
| GREEN | 1 | 1 | 0 | 0 | 25 | 54 | 42 |
| YELLOW | 1 | 1 | 0 | 1 | 50 | 72 | 85 |
| AQUA | 1 | 1 | 1 | 0 | 75 | 80 | 58 |
| WHITE | 1 | 1 | 1 | 1 | 100 | 100 | 100 |

TRUTH TABLE

| DIGITAL COLOR SIGNAL A 4 (C) | A 3 (I) | A 2 (B) | A 1 (G) | A 0 (R) | COLOR IN FORMAT F2 | TRANSLATED DIGITAL WORD D 7 | D 6 | D 5 | D 4 | D 3 | D 2 | D 1 | D 0 |
|---|---|---|---|---|---|---|---|---|---|---|---|---|---|
| 0 | 0 | 0 | 0 | 0 | BLACK | 0 | 0 | 0 | 0 | 0 | 0 | 0 | 0 |
| 0 | 0 | 0 | 0 | 1 | MAGENTA | 0 | 1 | 0 | 0 | 1 | 0 | 0 | 1 |
| 0 | 0 | 0 | 1 | 0 | DK.BLUE | 1 | 0 | 0 | 0 | 0 | 0 | 1 | 0 |
| 0 | 0 | 0 | 1 | 1 | PURPLE | 1 | 1 | 0 | 0 | 1 | 0 | 1 | 1 |
| 0 | 0 | 1 | 0 | 0 | DK.GREEN | 0 | 0 | 0 | 1 | 0 | 0 | 0 | 0 |
| 0 | 0 | 1 | 0 | 1 | DK.GREY | 0 | 1 | 0 | 1 | 1 | 0 | 0 | 1 |
| 0 | 0 | 1 | 1 | 0 | MD.BLUE | 1 | 0 | 0 | 1 | 0 | 0 | 1 | 0 |
| 0 | 0 | 1 | 1 | 1 | LT. BLUE | 1 | 1 | 0 | 1 | 1 | 0 | 1 | 1 |
| 0 | 1 | 0 | 0 | 0 | BROWN | 0 | 0 | 1 | 0 | 0 | 1 | 0 | 0 |
| 0 | 1 | 0 | 0 | 1 | ORANGE | 0 | 1 | 1 | 0 | 1 | 1 | 0 | 1 |
| 0 | 1 | 0 | 1 | 0 | LT.GREY | 1 | 0 | 1 | 0 | 0 | 1 | 1 | 0 |
| 0 | 1 | 0 | 1 | 1 | PINK | 1 | 1 | 1 | 0 | 1 | 1 | 1 | 1 |
| 0 | 1 | 1 | 0 | 0 | GREEN | 0 | 0 | 1 | 1 | 0 | 1 | 0 | 0 |
| 0 | 1 | 1 | 0 | 1 | YELLOW | 0 | 1 | 1 | 1 | 1 | 1 | 0 | 1 |
| 0 | 1 | 1 | 1 | 0 | AQUA | 1 | 0 | 1 | 1 | 0 | 1 | 1 | 0 |
| 0 | 1 | 1 | 1 | 1 | WHITE | 1 | 1 | 1 | 1 | 1 | 1 | 1 | 1 |
| | | | | | COLOR IN FORMAT F1 | | | | | | | | |
| 1 | 0 | 0 | 0 | 0 | BLACK | 0 | 0 | 0 | 0 | 0 | 0 | 0 | 0 |
| 1 | 0 | 0 | 0 | 1 | RED | 0 | 0 | 0 | 0 | 0 | 1 | 1 | 1 |
| 1 | 0 | 0 | 1 | 0 | GREEN | 0 | 0 | 1 | 1 | 1 | 0 | 0 | 0 |
| 1 | 0 | 0 | 1 | 1 | BROWN | 0 | 0 | 0 | 1 | 0 | 1 | 1 | 1 |
| 1 | 0 | 1 | 0 | 0 | BLUE | 1 | 1 | 0 | 0 | 0 | 0 | 0 | 0 |
| 1 | 0 | 1 | 0 | 1 | MAGENTA | 1 | 1 | 0 | 0 | 0 | 1 | 1 | 1 |
| 1 | 0 | 1 | 1 | 0 | CYAN | 1 | 1 | 1 | 1 | 1 | 0 | 0 | 0 |
| 1 | 0 | 1 | 1 | 1 | WHITE | 1 | 1 | 1 | 1 | 1 | 1 | 1 | 1 |
| 1 | 1 | 0 | 0 | 0 | GREY | 0 | 0 | 0 | 0 | 0 | 0 | 0 | 0 |
| 1 | 1 | 0 | 0 | 1 | LT. RED | 0 | 0 | 0 | 0 | 0 | 1 | 1 | 1 |
| 1 | 1 | 0 | 1 | 0 | LT.GREEN | 0 | 0 | 1 | 1 | 1 | 0 | 0 | 0 |
| 1 | 1 | 0 | 1 | 1 | LT. YELLOW | 0 | 0 | 1 | 1 | 1 | 1 | 1 | 1 |
| 1 | 1 | 1 | 0 | 0 | LT.BLUE | 1 | 1 | 0 | 0 | 0 | 0 | 0 | 0 |
| 1 | 1 | 1 | 0 | 1 | LT.MAGENTA | 1 | 1 | 0 | 0 | 0 | 1 | 1 | 1 |
| 1 | 1 | 1 | 1 | 0 | LT. CYAN | 1 | 1 | 1 | 1 | 1 | 0 | 0 | 0 |
| 1 | 1 | 1 | 1 | 1 | INT. WHITE | 1 | 1 | 1 | 1 | 1 | 1 | 1 | 1 |

FIG. 2

VIDEO MONITOR INTERFACE CIRCUIT FOR DIGITAL COLOR SIGNALS

BACKGROUND OF THE INVENTION

1. Field of the Invention

This invention relates to a color interface circuit for a video monitor which produces color images in response to signals supplied by a digital processor, and particularly to such an interface circuit which enables a monitor operating in a standard format of primary color analog input signals, such as Red, Green and Blue, to display colors signified by digital signals which are in various other color formats.

2. Description of the Related Art

Information produced by a digital processor is commonly displayed on the screen of a color CRT to permit visual monitoring of such information. The input terminals of the CRT monitor require signals which control the relative intensities of each of a set of three primary colors on the monitor screen, the standard set or format of primary colors being Red, Green and Blue. An intensity ("I") signal is also frequently added to the color signals to control their relatively purity with respect to a reference gray level. Since the processor produces digital output signals, digital-to-analog conversion is required to obtain corresponding analog signals for application to the monitor input terminals. This is one of the functions of a display interface circuit between the processor and the monitor. Certain kinds of processors, for example the type 5150 (RGBI) of IBM Corporation, produce digital signals respective bits of which, with few exceptions, respectively correspond to the individual R, G, B primary colors of the standard video monitor color format. Other processors, however, such as the type IIe (XRGB) of Apple Computer Corporation, produce digital signals which completely depart from the standard primary color format and are intended for a monitor specifically adapted to operate in the format of that particular processor. With such processors, respective bits of the digital signal identify colors which are actually combinations of different proportions of the standard R, G and B primary colors. Consequently, it has not been possible to employ the same monitor for such processors as well as for processors operating in the standard B, G and R color format. Suppliers of different kinds of digital processors have therefore had to maintain in inventory almost an equal number of matching display monitors, and purchasers of particular processors have been limited in the choice of monitors available to them.

Although it is technically feasible to devise interface circuits which translate the digital output signals of a particular processor from one color format to another, circuits capable of translating from any of a variety of different color formats have been found to be inordinately complicated and more expensive than simply providing alternative monitors having color formats matching the processors with which they are to be used.

SUMMARY OF THE INVENTION

The invention provides a color interface circuit for translating digital signals signifying colors in any of various color formats into analog signals for controlling respective primary colors of a video monitor displaying colors in a standard color format, whereby the colors displayed by the monitor match the colors signified by the digital signals. For translation from either of two color formats, the interface requires only a single control line in order to switch from translation of digital signals corresponding to one of such formats to translation of digital signals corresponding to the other of such formats. Translation of more than two formats would of course require a sufficient number of control lines to identify them; e.g., two control lines (in addition to the four color address lines) would permit translation of up to four formats.

A color interface circuit in accordance with the invention comprises digital memory means which stores therein a plurality of digital words respectively corresponding to each of the colors signified by respective digital color signals, each such digital word having a predetermined number of bits, such memory means reading-out the digital word corresponding to any digital color signal upon receiving such signal. The circuit further comprises a plurality of word bit combining networks which respectively produce analog color signals corresponding to weighted summations of the bits of a digital word applied thereto, such analog signals respectively corresponding to the respective primary colors of the video monitor, such combining networks being connected to the memory means to receive the bits of a digital word read-out therefrom in response to a received digital color signal. The combining networks weight the bits of a digital word applied thereto so that the relative proportions of the weighted analog summations thereof are the same as the relative proportions of the primary colors of the video monitor for displaying a color matching the color signified by the digital color signal.

In a preferred embodiment, the interface circuit comprises switching means for altering the digital value of a control bit included in each of the digital words stored in the digital memory means, whereby the digital word supplied to the combining networks can be altered in correspondence with the color format of the received digital color signals.

BRIEF DESCRIPTION OF THE DRAWINGS

FIG. 1A is a table showing the digital color signal format of one type of digital processor, the IBM Corporation type 5150 (RGBI);

FIG. 1B is a table showing the digital color signal format of another type of digital processor, the Apple Computer Corporation type IIe (XRGB);

FIG. 2 is a Truth Table showing translation of digital color signals into digital words respectively corresponding to each of the colors signified by such signals in either of two different color formats;

DESCRIPTION OF THE PREFERRED EMBODIMENTS

Figure 3:
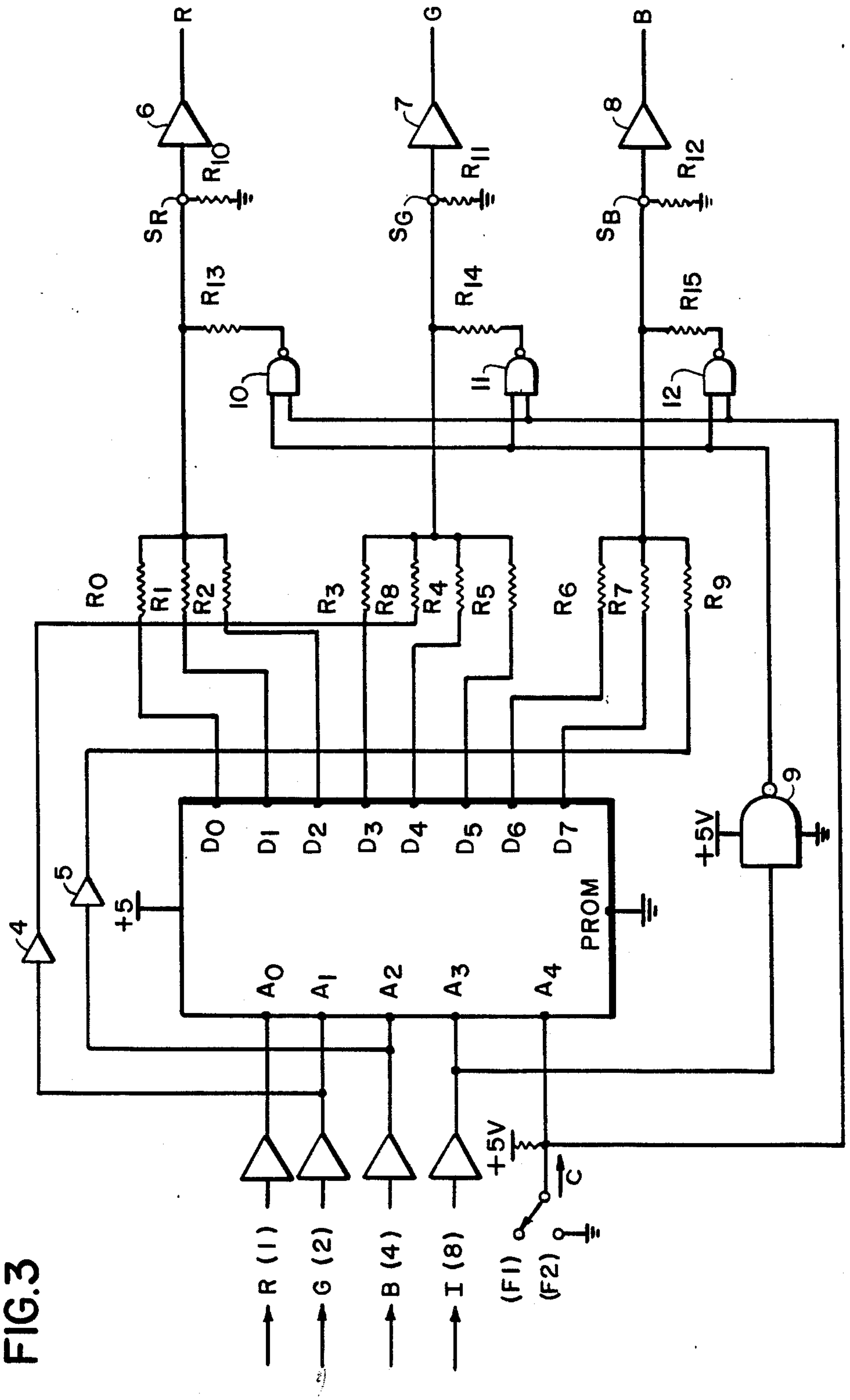
FIG. 3 is a circuit drawing of a color interface circuit in accordance with the invention.

Referring to the table in FIG. 1A, the first two columns thereof show the colors corresponding to all possible digital color signals produced by a typical digital processor such as the IBM Corporation type 5150 (RGBI). Each signal comprises four bits generically identified by their binary order 1, 2, 4 or 8, from the least to the most significant bit. In the case of this particular processor they may also be regarded as R, G, B and I signals, the I signal controlling the gray level of the displayed color. Since there are sixteen possible combinations of four bits, there are sixteen possible colors corresponding thereto. This color format will be referred to hereinafter as color format F1. The B, G and R digital signals are intended for respective input terminals of a color display monitor associated with the processor, the I signal being applied in common to all terminals to establish a gray intensity level on the monitor screen. When the I signal is a "1" the displayed colors are less saturated, or lighter, then when it is "0". Applicant has found that, with one exception, the R, G, and B digital signals of this processor respectively correspond to the R, G and B analog signal inputs of a video monitor operating in the standard R, G and B color format. That is, a "1" level of the digital "R" signal signifies the same analog signal level at the R input terminal for every color to which such digital R signal contributes, and similarly for the B and G digital signals. The sole exception is in the case of the color brown, which is produced by "1" level digital G and R signals. In that case, in order to obtain the same hue of brown on a standard color format video monitor as on the monitor associated with this particular processor, the analog G signal corresponding to a "1" digital G signal must be reduced by approximately 30% from the level which a "1" digital G signal signifies for any other color to which the digital G signal contributes. Applicant has also found that to duplicate the effect of the digital I signal on any composite displayed color the intensity levels of each of the analog primary color signals contributing to such composite color must be increased by 33% with respect to their zero reference level.

From the foregoing observations, applicant has established the relative amplitudes of analog signals in the standard B, G and R primary color format in order for a video color monitor operating in the standard primary color format to display colors matching those signified by digital color signals in the F1 color format. These relative amplitudes are shown in the 3 columns in the right-hand portion of FIG. 1A.

A digital color signal format which totally departs from the standard R, G and B format is shown by the table in FIG. 1B, which is applicable to the Apple Computer Corporation IIe (XRGB) digital processor. This is referred to hereafter as color format F2. As seen in the first two columns of the table, the four bits of each digital signal from the processor have for convenience of identification been denoted I, B, G and R. However, the sixteen possible monitor display colors signified by these signals are altogether different from those signified by the digital color signals in the format of FIG. 1A and from those of digital signals in the standard R, G, B color format. Although the I signal contributes to half of all the sixteen colors, as it also does in FIG. 1A, since alone it results in brown it is obviously not equivalent to the gray level intensity signal I in the F1 color format of FIG. 1A. Applicant has determined the relative proportions of B, G and R analog signals in the standard color format in order to result in video monitor colors matching those signified by digital color signals in the F2 color format on the video monitor associated with the above-identified Apple Computer Corporation digital processor. Those proportions are shown in the right-hand three columns of FIG. 1B. It is seen that 5 different relative amplitude levels of the B analog signal are required, 8 different levels of the G signal, and 6 different levels of the R signal.

Since the 0 and 1.0 levels occur in both FIGS. 1A and 1B, in order for the interface circuit to also provide analog color signal weighting for the F1 color format 2 additional B analog signal levels are required, 3 additional G analog signal levels, and 2 additional R analog signal levels. Thus, a total of 7 B levels, 11 G levels, and 8 R levels are necessary, representing analog signal relative weighting factors for translation o digital color signals in either of color formats F1 and F2 into analog color signals in the standard R, G, B video monitor color format. This means that if analog signal attenuating elements are employed to provide the necessary weighting factors, at least 3 such elements are required for the B analog signal, 4 elements for the G analog signal and 3 elements for the R analog signal, making a total of 10 such elements.

An interface circuit for translating digital color signals in either the F1 or F2 color format into analog color signals in the standard format must first translate each of the 32 possible digital signals into digital words which identify the relative weightings of such analog color signals so as to result in the same colors on the video monitor as those represented by the input digital words. Since different combinations of 10 analog weighting elements are sufficient to supply the necessary number of weighting factors, translation to digital words comprising 10 bits could be employed. However, since standard digital integrated circuits are designed for processing digital words which are in multiples of 8 bits, it is preferable to translate to 8 bit digital words and to derive 2 additional bits directly from the input digital color signals. This is described in more detail hereinafter. Translation to 8 bit digital words may be effected in accordance with the truth table shown in FIG. 2, wherein the inputs represent digital color signals in either of the primary color formats F1 and F2. In the truth table the B, G, R and I bits have been supplemented by fifth control bit C which identifies the particular primary color format to which the color signals relate; e.g., a "0" for color format F1 and a "1" for color format F2. The resulting 32 sets of five bits, designated $A_0$–$A_4$, may serve as the addresses of 32 locations in digital memory means, such as a programmable read-only memory (PROM), each such location storing an 8-bit word. The respective bits of such words constitute the inputs to an analog weighting network, such as described hereinafter, which derive weighted summations thereof signifying the relative proportions of B, G and R analog color signals in the standard color format so as to cause the video monitor to produce colors matching those signified by the corresponding digital input signals.

In FIG. 3 is shown an interface circuit in accordance with the foregoing description. It comprises a digital memory 1 which may be a PROM such as the type 82S123 manufactured by Signetics Corporation and having five inputs $A_0$–$A_4$ and eight outputs $D_0$–$D_7$. Conventional ROMS, EPROMS and other kinds of memories could also be employed. Memory 1 is conventionally powered so that a "1" bit is, for example, at a fixed potential and a "0" bit is at ground potential. If the power supply provides +5V, a "1" bit will be at that potential. The R, G, B and I bits of the digital color signals are respectively applied to inputs $A_0$–$A_3$. The control bit C is provided by applying either ground or a +5V supply potential via a resistor to input terminal $A_4$, a switch 2 being operable to selectively connect or disconnect terminal $A_4$ to or from ground. Thus, operation of switch 2 sets the C bit to "0" and when not operated the C bit at terminal $A_4$ is a "1". As described above with reference to the truth table in FIG. 2, this means that when switch 2 is not operated PROM 1 is set for translation of digital signals in the F1 color format and when switch 2 is operated PROM 1 is set for translation of digital signals in the F2 color format. The eight bits of the translate digital word corresponding to each input digital signal are produced at outputs $D_0$–$D_7$ of PROM 1, in accordance with the truth table in FIG. 2. Outputs $D_0$–$D_2$ are respectively connected by three attenuating elements such as resistors $R_0$–$R_2$ to a summing terminal $S_R$ which is returned to ground by an attenuating element such as a resistor R10. Resistors $R_0$–$R_2$ are proportioned to establish the requisite analog weighting factors for deriving the analog R color signal produced by the translator. Outputs $D_3$–$D_5$ of PROM 1 are respectively connected by attenuating elements such as resistors $R_3$–$R_5$ to a summing terminal $S_G$ which is returned to ground by an attenuating element such as a resistor R11. Resistors $R_3$–$R_5$ are proportioned to establish the requisite analog weighting factors for deriving the analog G color output signal produced by the translator. Outputs $D_6$ and $D_7$ are respectively connected by attenuating elements such as resistors $R_6$ and $R_7$ to a summing terminal $S_B$ which is returned to ground by an attenuating element such as a resistor $R_{12}$ and are proportioned to establish the requisite analog weighting factors for deriving the analog B color signal produced by the translator.

As noted above, the analog G signal requires 11 different weighting levels, which can be provided by least 4 attenuating elements. Accordingly, besides being utilized for color translation by PROM 1, the input digital signal G bit at input terminal $A_1$ is also routed around PROM 1 and supplied through a buffer amplifier 4 and another attenuating element such as a resistor $R_8$ directly to G summing terminal $S_G$. Similarly, since the B analog signal requires 7 weighting levels, besides being utilized for color translation by PROM 1 the B bit of the digital signal at input terminal $A_2$ is further routed around PROM 1 and supplied through a buffer amplifier 5 and an attenuating element such as a resistor $R_9$ directly to B summing terminal $S_B$. Resistors $R_8$ and $R_9$ are respectively proportioned relative to the other analog weighting resistors connected to terminals $S_G$ and $S_B$, respectively, to establish the further analog weighting factors required for those signals as shown in FIGS. 1A and 1B.

Summing terminals $S_R$, $S_G$ and $S_B$ are respectively connected to ground reference potential by resistors $R_{10}$, $R_{11}$, $R_{12}$, and these are selected to have relatively low attenuation or resistance relative to each of the analog signal weighting resistors connected to the summing terminals. The voltages at those terminals will therefore respectively be proportional to the sum of the reciprocals of the resistances of the weighting resistors connected thereto. The analog summation voltages so produced at summing terminals $S_R$, $S_G$ and $S_B$ are applied to the inputs of respective buffer amplifiers 6, 7 and 8 connected thereto, such as emitter follower transistor amplifiers, in order to obtain reduced output impedance. The output signals from amplifiers 6, 7 and 8 thereby constitute R, G and B analog signals for application to a video monitor CRT operating in the standard color format.

As indicated above, in the F1 color format the I bit of each digital signal affects the gray or luminence level of each of the analog color signals as well as the color hues corresponding thereto. However, in the case of the F2 color format the I bit only affects the color hues of the analog color signals. In order to take this difference into account, the I bit of the input digital color signal is also applied via an inverter 9 to an input of each of three NAND gates 10, 11, 12, the outputs of which are respectively connected by analog weighting elements such as resistors $R_{13}$, $R_{14}$, $R_{15}$ to the respective analog summing terminals $S_R$, $S_G$, and $S_B$. The signal attenuation or resistance of these resistors is set in such proportions relative to the other analog summing resistors connected to the corresponding running terminals to provide I signal weighting factors in accordance with color format $F_1$ as shown in FIG. 1A. The control bit C, besides setting PROM 1 for color translation in accordance with either of color formats $F_1$ and $F_2$, is also utilized to gate the I signal. For that purpose, control bit C is applied to a second input of each of NAND gates 10, 11 and 12. Thus, when the control signal C is a "1", corresponding to color format $F_1$, a "1" I bit will be inverted into a "0" by inverter 9 and applied to each of NAND gates 10, 11 and 12. These gates will therefore each produce a "1" output bit, or a +5V potential, and resistors $R_{13}$, $R_{14}$ and $R_{15}$ will contribute to the resistive weightings effected at terminals $S_R$, $S_G$ and $S_B$. This effectively increases the voltage level corresponding to a "0" color signal summation at each such terminal from ground potential to approximately 33% of the maximum voltage which is produced thereat when all the color signal bits are "1", which corresponds to the effect of the I bit on the analog color signal weighting factors for color format $F_1$ as shown in FIG. 1A.

When the control bit C is a "0", corresponding to color format $F_2$, the outputs of NAND gates 10, 11 and 12 remain at "1", or +5V, regardless of whether the I bit is a "0" or a "1". Changes in the I signal therefore will not affect the analog color signal weightings effected by the resistive networks connected to terminals $S_R$, $S_G$ and $S_B$ except insofar as the I bit enters into the digital word translation of the digital color signals effected by PROM 1.

The operation of the color interface circuit in FIG. 3 will be explained by two examples: translation of light blue in color format $F_2$, and of brown in color format $F_1$. These examples are respectively illustrated in FIGS. 4 and 5, wherein the block 10 labeled "decode logic" represents the portion of the complete interface circuit in FIG. 3 comprising PROM 1 and the interconnections of the G and B inputs thereto to the G auxiliary summing resistor $R_8$ and the B auxiliary summing resistor $R_9$.

Light blue in color format F2, as shown in the Truth Table in FIG. 2, is signified by a digital input signal 11100. Accordingly, these are the input digital signal bits in FIG. 4. Decode logic block 10 translates that digital signal to a digital word as shown in FIG. 2, which results in +5V on the outputs of logic block 10 corresponding to the "1" bits in the translated digital word. The remaining "0" outputs will be at ground potential. The analog voltage corresponding to summation of these digital voltages, weighted in proportion to the reciprocals of the resistances of the weighting resistors connected to these outputs, will be produced at terminals $S_R$, $S_G$ and $S_B$. These weighting proportions are set in accordance with the weighting factors shown in FIGS. 1A and 1B. By way of example, a suitable set of relative resistances of the various weighting resistors, and the corresponding inverse values or conductances thereof, is as follows:

| | Weighting Resistor | Resistance (K Ohms) | Conductance ($10^{-3}$ Mhos) |
|---|---|---|---|
| $S_R$ | $R_0$ | 1.5 | .67 |
| | $R_1$ | 3.9 | .26 |
| | $R_2$ | 1.5 | .67 |
| $S_G$ | $R_3$ | 4.7 | .213 |
| | $R_4$ | 2.7 | .37 |
| | $R_5$ | 2.7 | .37 |
| | $R_8$ | 2.7 | .37 |
| $S_B$ | $R_6$ | 2.7 | .37 |
| | $R_7$ | 1.2 | .83 |
| | $R_9$ | 2.7 | .37 |

The summed output voltage at any summing terminal is proportional to the sum of the conductances connected thereto. Accordingly, the maximum voltages at terminals $S_R$, $S_G$ and $S_B$ will be respectively proportional to 1.60, 1.323 and 1.57.

In the example illustrated, the summed voltage at terminal $S_R$ will be proportional to the sum of the conductances of resistors $R_0$ and $R_1$, or $0.93\times10^{-3}$ Mhos. This is $0.93/1.6=58\%$ of the maximum output voltage at terminal $S_R$, which is the relative amplitude of the R analog signal corresponding to the red primary color component of the standard R, G, B format in order to produce a light blue matching the light blue color of color format F2 as shown in FIG. 1B.

The summed voltage at terminal $S_G$ will be proportional to the sum of the conductances of resistors $R_3$, $R_4$ and $R_8$, or $0.953\times10^{-3}$ Mhos. This is $0.93/1.323=72\%$ of the maximum output voltage terminal $S_G$, which is the relative amplitude of the G analog signal corresponding to the green primary color component of the standard R, G, B format in order to produce the light blue of format F2.

In the case of the summed voltage at terminal $S_B$, this will be at its maximum amplitude since all weighting resistors connected thereto are at +5V. Thus, its relative amplitude will be 100%, which is in agreement with the relative amplitude of the B analog signal necessar to produce the light blue color of color format F2 as shown in FIG. 1B.

It will therefore be apparent that the R, G and B analog output signals produced by the interface circuit in FIG. 3 in response to a digital input signal signifying the light blue color of color format F2 will be in the correct relative proportions to produce a matching light blue color on a video display monitor operating in the standard R, G, B color format.

Figure 4:
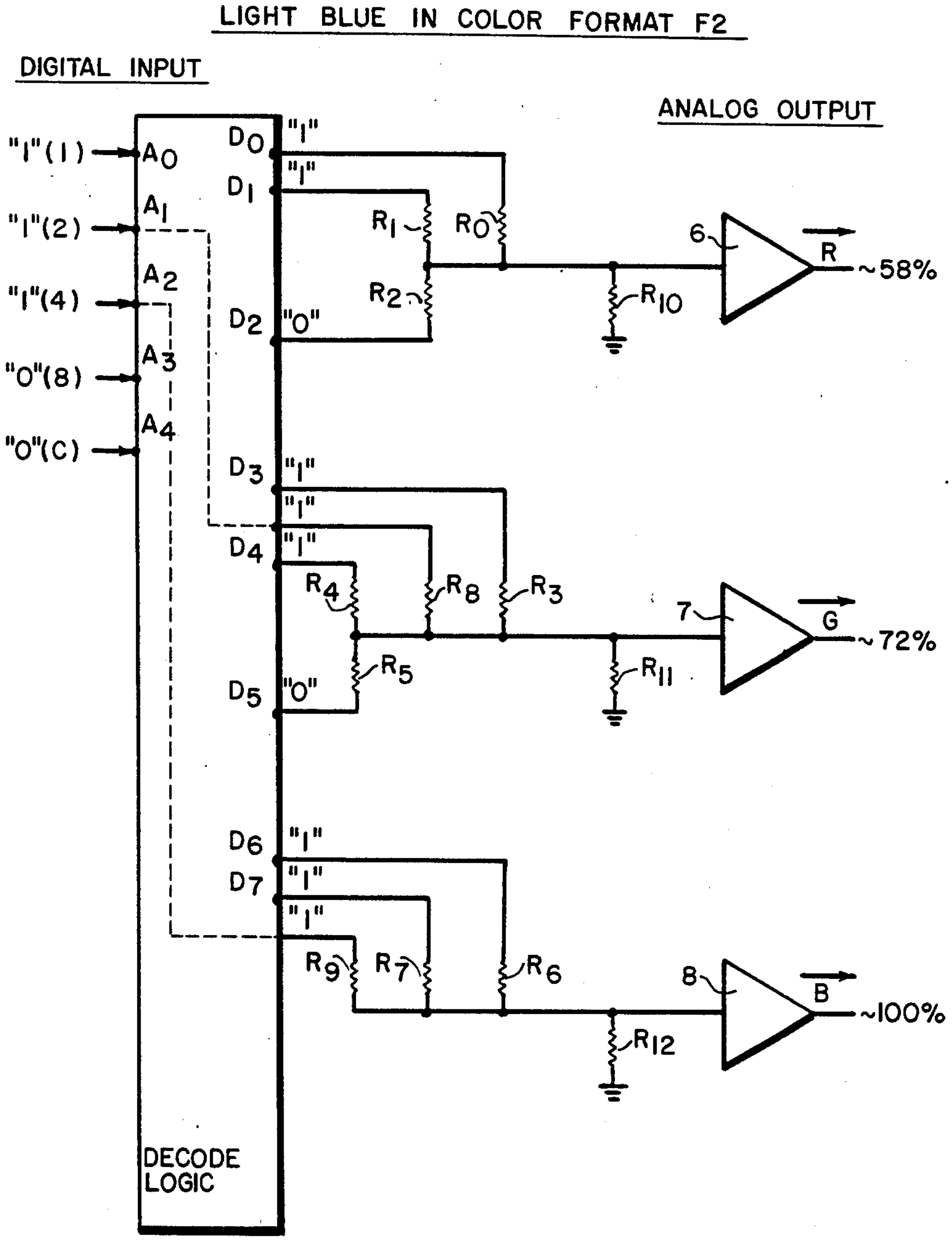
FIG. 4 is an abbreviated drawing of the circuit of FIG. 3 showing its operation in response to digital signals signifying the color light blue in the color format of FIG. 1A.

FIG. 4 omits the resistors R13, R14 and R15 even though they are actually in the I signal bit paths connected to terminals $S_R$, $S_G$ and $S_B$ as shown in FIG. 3. This is because, as explained above, when the control signal bit C is "0" the outputs of NAND gates 10, 11 and 12 remain at "1" regardless of the value of the digital I bit. Consequently, the presence of resistors R13, R14 and R15 does not alter the percentage changes in the magnitudes of the voltages at terminals $S_R$, $S_G$ and $S_B$ in response to changes in the translated digital color signals.

Figure 5:
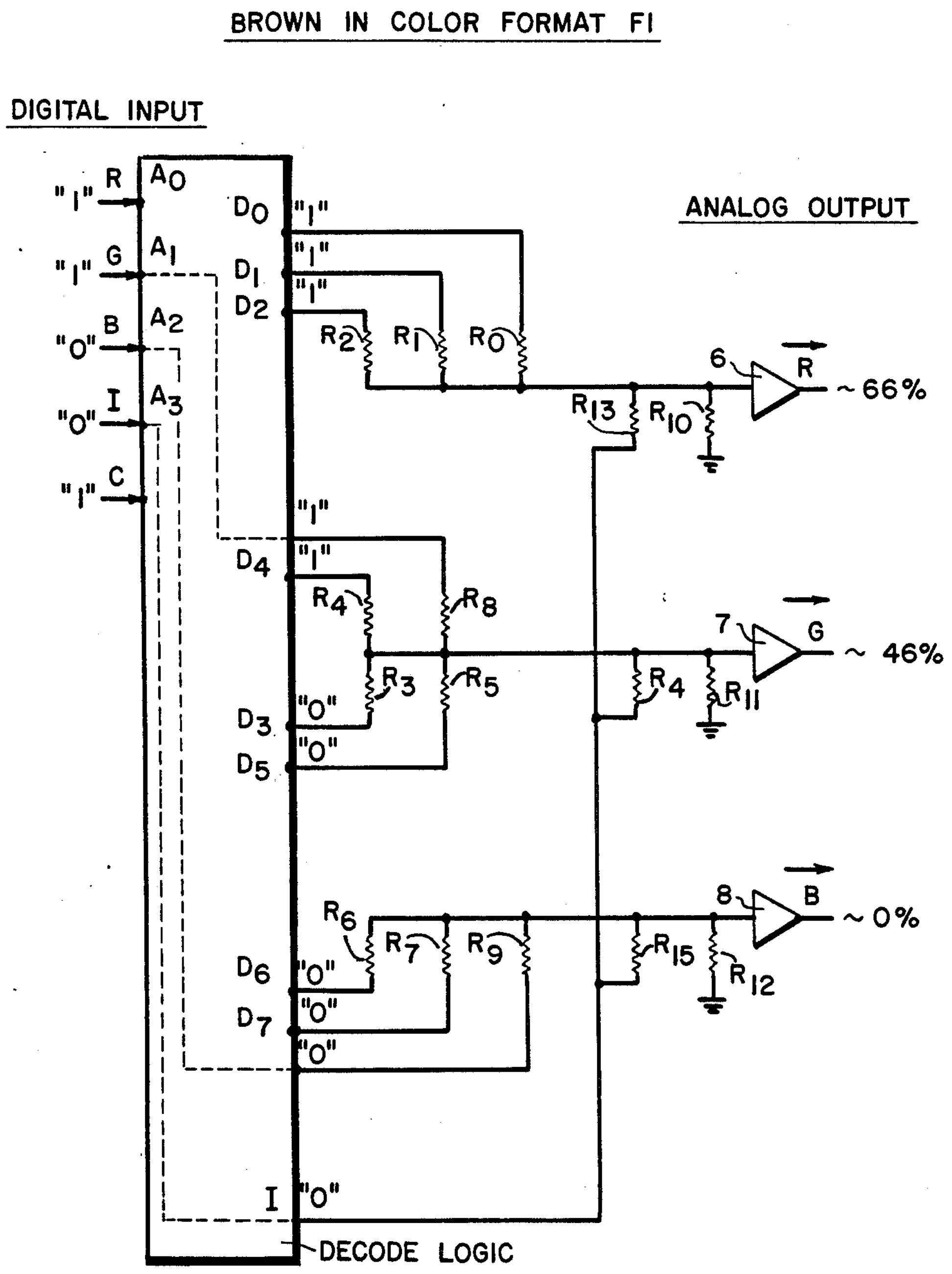
FIG. 5 is an abbreviated drawing of the circuit of FIG. 3 showing its operation in response to digital signals signifying the color brown in the color format of FIG. 1B.

Referring now to FIG. 5, illustrating production of the color brown in color format F1, the digital input signal as shown by the Truth Table in FIG. 2 is 11001. The corresponding translated digital word in FIG. 2 results in digital signals at the outputs of decode logic block 10 as shown in FIG. 5, including the "1" G signal routed to resistor $R_8$ connected to G summing terminal $S_G$ and the "0" B signal routed to resistor $R_9$ connected to the B summing terminal $S_B$. FIG. 5 also includes the resistors R13, R14 and R15 which, as shown in FIG. 3, are connected to the respective summing terminals $S_R$, $S_G$ and $S_B$ and to which the input digital I bit is routed after being inverted by inverter 9 and gated by NAND gates 10, 11 and 12 as described above. Since the control bit "C" is "1" for all colors in color format F1, and since for the color brown in that format the I bit is "0", the NAND gates will apply ground potential to each of resistors R13, R14 and R15. The resistances of these resistors are proportioned in relation to the other weighting resistors connected to corresponding ones of summing terminals $S_R$, $S_G$ and $S_B$ so as to obtain the analog color signal weightings shown in FIG. 1 for color format F1. Typical resistances of resistors R13, R14 and R15 are 1.2K Ohm, 3.4K Ohm and 1.2K Ohm. The sum of the conductances of all weighting resistors $R_0$, $R_1$, $R_2$ and $R_{13}$ connected to summing terminal $S_R$ is $2.43\times10^{-3}$ Mhos, and the corresponding sums for summing terminals $S_G$ and $S_B$ are 1.61 and 2.4 respectively. Since only weighting resistors $R_0$ and $R_1$ connected to R summing terminal $S_R$ are at the "1" or +5V level, and the sum of their conductances is $1.60\times10^{-3}$ Mhos, the summed voltage at terminal $S_R$ will be $1.60/2.43=66\%$ of the maximum voltage at that terminal. A similar calculation for the weighting resistors connected to G summing terminal $S_G$ shows that the summed voltage thereat will be 46% of its maximum value. In the case of B summing terminal $S_B$, since all of the weighting resistors connected thereto are at the "1" level the summed voltage thereat will be equal to 100% of its maximum value. These percentages agree with those shown in FIG. 1A for producing the color brown in format F1.

While the invention has been described with reference to certain specific embodiments thereof, it will be evident to those skilled in the art that many variations and modifications thereof may be made without departing from the true teachings and scope of the invention as defined in the succeeding claims.

What is claimed is:

1. A color interface circuit for translating digital signals signifying colors in any of various color formats into analog signals for controlling respective primary colors of a video monitor displaying colors in a standard color format, one of the bits of each such signal signifying a grey intensity level; such circuit comprising:

digital memory means having stored therein a plurality of digital words respectively corresponding to the colors signified by the respective digital color signals, each such digital word having a predetermined number of bits, said memory means being adapted to read-out the digital word corresponding to any digital color signal upon receiving such digital color signal;

a plurality of digital word bit combining networks which respectively produce analog color signals corresponding to weighted summations of the bits of a digital word applied thereto, such analog signals respectively corresponding to the respective primary colors of said video monitor, said combining networks being connected to said memory means to receive the bits of the digital word read-out therefrom in response to a digital color signal received thereby; each of said combining networks weighting the bits of a digital word applied thereto so that the relative proportions of the weighted analog summations thereof match the relative proportions of the primary colors of said video monitor for displaying the color signified by the digital color signal received by said memory means;

switching means connected to said digital memory means for adding at least one control bit to each of the digital color signals received thereby, said switching means being operable to set the digital value of each such control bit in correspondence with the color format of the received digital color signals; whereby the digital word read-out from said memory means in response to a received digital color signal can be altered by said switching means so as to correspond with the particular color format of such received digital color signal;

a signal attenuating element in each of said combining networks for receiving said grey intensity level bit of a received digital color signal; and gating means controlled by the control bits added to the received digital color signal for gating the application of said grey intensity level bit to said grey level signal attenuating elements in said conbining networks; whereby the relative proportions of the analog signals produced by said combining networks are adjusted in accordance with the effect of said grey intensity level bit on the colors signified by the received digital color signal.

2. A color interface circuit in accordance with claim 1, wherein each of said combining networks comprises a plurality of signal attenuating elements to which the bits of a digital word read-out from said memory means are respectively applied, the relative signal attenuations of such attenuating elements being proportioned so as to produce said weighted summations of the bits of said digital word.

3. A color interface circuit in accordance with claim 2, wherein said signal attenuating elements are resistor means.

4. A color interface circuit in accordance with claim 1, wherein said gating means comprises:

an inverter for inverting said gray intensity level bit; and a plurality of NAND circuits respectively having a first input connected to said inverter, a second input connected to said switching means, and an output connected to one of said combining networks.

5. A color interface circuit in accordance with claim 4, wherein said memory means is a solid-state programmable read-only memory.

* * * * *